(12) United States Patent
Uemura

(10) Patent No.: US 7,071,495 B2
(45) Date of Patent: Jul. 4, 2006

(54) III GROUP NITRIDE SYSTEM COMPOUND SEMICONDUCTOR LIGHT EMITTING ELEMENT AND METHOD OF MAKING SAME

(75) Inventor: Toshiya Uemura, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/694,811

(22) Filed: Oct. 29, 2003

(65) Prior Publication Data
US 2004/0089869 A1    May 13, 2004

(30) Foreign Application Priority Data
Oct. 31, 2002    (JP)    ............... 2002-317745

(51) Int. Cl.
*H01L 33/00*    (2006.01)
(52) U.S. Cl. .................. 257/98; 257/96; 257/103
(58) Field of Classification Search .................. 257/98, 257/103, 96
See application file for complete search history.

(56) References Cited

U.S. PATENT DOCUMENTS

| 6,046,465 A | * | 4/2000 | Wang et al. ............... 257/98 |
| 2002/0074558 A1 | * | 6/2002 | Hata et al. ................ 257/89 |

FOREIGN PATENT DOCUMENTS

| JP | 10-312971 | 11/1998 | |
| JP | 2000-349338 | 12/2000 | |
| JP | 2001-267242 | 9/2001 | |
| WO | WO 99/53578 | * 10/1999 | ............... 257/98 |

OTHER PUBLICATIONS

Kazuyuki Tadatomo, et al., "High Output Power InGaN Ultraviolet Light-Emitting Diodes Fabricated on Patterned Substrates Using Metalorganic Vapor Phase Epitaxy", Jpn. J. Appl. Phys. vol. 40 (2001), pp. L583-L585, Part 2, No. 6B, Jun. 15, 2001.

* cited by examiner

Primary Examiner—Jerome Jackson
(74) Attorney, Agent, or Firm—McGinn IP Law Group, PLLC

(57) ABSTRACT

A III group nitride system compound semiconductor light emitting element has: a transparent substrate that is of a material except for III group nitride system compound semiconductor; a convex light trapping member that is formed directly or through a buffer layer on the surface of the transparent substrate; and a III group nitride system compound semiconductor layer that is formed on the surface of the transparent substrate. The light trapping member has a refractive index substantially equal to that of the transparent substrate or closer to that of the transparent substrate than that of the III group nitride system compound semiconductor layer.

22 Claims, 7 Drawing Sheets

1 SAPPHIRE SUBSTRATE

2 LIGHT TRAPPING MEMBER LAYER
1

3 PHOTOMASK
2
1

3
2
1

2 LIGHT TRAPPING MEMBER
1

5a 5b 5 BUFFER LAYER
2
10 BASE STRUCTURE
1

III GROUP NITRIDE SYSTEM COMPOUND SEMICONDUCTOR LIGHT EMITTING ELEMENT AND METHOD OF MAKING SAME

The present application is based on Japanese patent application No.2002-317745, the entire contents of which are incorporated herein by reference.

BACKGROUND OF THE INVENTION

1. Field of the Invention

This invention relates to improvement in III group nitride system compound semiconductor light emitting element.

2. Description of the Related Art

Conventionally, in making the III group nitride system compound semiconductor light emitting element (hereinafter also referred to simply as light emitting element), III group nitride system compound semiconductor layer is grown on the mirror-finished surface of a sapphire substrate through buffer layer. Critical angle at the interface of sapphire substrate and III group nitride system compound semiconductor layer is no more than about 47 degree because there is a big difference in refractive index therebetween. Therefore, some component of light emitted from the III group nitride system compound semiconductor layer can be returned to the semiconductor layer while being subjected to total reflection at the interface. Light returned to the semiconductor layer is attenuated due to scattering or absorption in crystal of the semiconductor layer. Thus, the big difference in refractive index between sapphire substrate and III group nitride system compound semiconductor layer prevents light emitted from III group nitride system compound semiconductor layer from being taken out efficiently.

So, it is suggested to form a pattern on the surface of sapphire substrate (Japanese patent application laid-open No.2001-267242 (prior art 1), Kazuyuki Tadatomo et al., "High Output Power InGaN Ultraviolet Light-Emitting Diodes Fabricated on Patterned Substrates Using Metalorganic Vapor Phase Epitaxy") For example, prior art 1 discloses to form a pattern of ridges and grooves (depth: 1.5 μm) of 3 μm wide respectively on sapphire substrate by photolithography. Thereby, light entering at a big angle into the interface of sapphire substrate and III group nitride system compound semiconductor layer can be taken out from the sidewall of groove to enhance the light extraction efficiency.

Also, Japanese patent application laid-open Nos. 10-312971 and 2001-349338 disclose partially relevant techniques to the invention.

On the other hand, by patterning the surface of substrate, the lateral growth of III group nitride system compound semiconductor layer based on the sidewall of groove can be promoted. This prevents penetrating crystal transition in the vertical direction of III group nitride system compound semiconductor layer from occurring. Therefore, the crystal quality can be enhanced.

However, from the research of the inventor, it is found that it is difficult to promote uniformly the lateral growth on the entire surface of wafer even if the entire surface of wafer is patterned. Namely, it is difficult to grow III group nitride system compound semiconductor layer with a good crystal quality on the entire surface of wafer. As a result, the patterning of substrate causes a reduction in yield and an increase in the manufacturing cost of light emitting element.

Further, when III group nitride system compound semiconductor layer is grown in the groove formed by patterning, a cavity may be generated in the groove (See prior art 1). In this case, there occurs a big difference in refractive index between the cavity and III group nitride system compound semiconductor layer. Therefore, light emitted from III group nitride system compound semiconductor layer will be reflected on the wall of cavity. As a result, the light extraction efficiency lowers.

In addition, sapphire, which is commonly used as transparent substrate material, is difficult to process since it is hard and fragile. In other words, it limits the degree of freedom in forming the uneven pattern on the surface.

SUMMARY OF THE INVENTION

It is an object of the invention to provide a light emitting element that has III group nitride system compound semiconductor layer with a good crystal quality grown on the entire surface of substrate without lowering the light extraction efficiency.

It is a further object of the invention to provide a method of making a light emitting element that has III group nitride system compound semiconductor layer with a good crystal quality grown on the entire surface of substrate without lowering the light extraction efficiency.

According to the invention, a III group nitride system compound semiconductor light emitting element, comprises:

a transparent substrate that is of a material except for III group nitride system compound semiconductor;

a convex light trapping member that is formed directly or through a buffer layer on the surface of the transparent substrate; and a III group nitride system compound semiconductor layer that is formed on the surface of the transparent substrate;

wherein the light trapping member has a refractive index substantially equal to that of the transparent substrate or closer to that of the transparent substrate than that of the III group nitride system compound semiconductor layer.

Furthermore, according to the invention, a method of making a III group nitride system compound semiconductor light emitting element, comprises the steps of:

forming a convex light trapping member directly or through a buffer layer on the surface of a transparent substrate; and forming a III group nitride system compound semiconductor layer on the surface of the transparent substrate.

In the invention, the convex light trapping member is formed on the surface of the transparent substrate to give the uneven surface. The light trapping member has a refractive index substantially equal to or close to that of transparent substrate and, therefore, from the viewpoint of light reflection and transmission, the light trapping member can be regarded as integrated with the transparent substrate. Thus, the uneven surface of transparent substrate prevents light emitted from III group nitride system compound semiconductor layer from being subjected to total reflection. Therefore, the light extraction efficiency can be enhanced by that much.

Further, the growth base point of III group nitride system compound semiconductor is the surface of substrate, which means region where the light trapping member does not exist or region between light trapping members, since it is difficult to growth the crystal of III group nitride system compound semiconductor from the surface of light trapping member. Namely, the III group nitride system compound semiconductor is grown in the vertical direction from, as the growth base point, the surface of substrate (or buffer layer)

between light trapping members. This can securely prevent the occurrence of cavity between light trapping members.

In addition, the light trapping member has a high degree of freedom in designing since it is formed independently of the substrate.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1A:
FIGS. 1A to 1F are cross sectional views showing a method of making a base structure to compose a light emitting element in a preferred embodiment of the invention.

Components to be used for a light emitting element in the preferred embodiment according to the invention are explained below.

[Substrate]

A substrate used in the embodiment is not limited if it can transmit light emitted from III group nitride system compound semiconductor layer and allows III group nitride system compound semiconductor layer to be grown on the substrate. For example, it may be of sapphire, spinel, zirconium boride, silicon carbide, zinc oxide, magnesium oxide, manganese oxide etc. Especially, sapphire substrate is preferable and a-face of sapphire substrate is further preferable.

Meanwhile, with respect to a substrate of III group nitride system compound semiconductor layer, the crystal quality of semiconductor layer and the difference of refractive index do not matter since the substrate and semiconductor layer are of the same material. Therefore, the substrate of III group nitride system compound semiconductor layer is eliminated from the invention.

The substrate has convex light trapping members on the surface. The pattern of light trapping members may be in arbitrary form such as stripe, lattice, spots etc. In case of light trapping member with stripe form, the width and pitch are made to be 0.1 to 10 μm and 0.2 to 20 μm, respectively, and the height of light trapping member is made to be about 0.1 to 5 μm. The uneven pattern is formed on the entire surface of substrate. The uneven pattern may be formed by etching, lift-off etc.

[III Group Nitride System Compound Semiconductor Layer]

III group nitride system compound semiconductor layer of light emitting element in the embodiment is represented by a general formula, $Al_xGa_yIn_{1-x-y}N$ ($0 \leq x \leq 1$, $0 \leq y \leq 1$, $0 \leq x+y \leq 1$) and includes a two-element system compound of AlN, GaN and InN and a three-element system compound of $Al_xGa_{1-x}N$, $Al_xIn_{1-x}N$ and $Ga_yIn_{1-x}N$ ($0 < x < 1$). Part of III group element may be replaced by boron (B), thallium (Tl) etc. and part of nitrogen (N) may be replaced by phosphorus (P), arsenic (As), antimony (Sb), bismuth (Bi) etc. The light emitting element of the invention is fabricated laminating such III group nitride system compound semiconductor layer. The structure of light emitting element may include quantum well (multiquantum well or single quantum well) of III group nitride system compound semiconductor layer and may be of single-hetero type, double-hetero type or homo junction type.

III group nitride system compound semiconductor layer may include arbitrary dopant. For example, n-type impurity available is silicon (Si), germanium (Ge), selenium (Se), tellurium (Te), carbon (c) etc. p-type impurity available is magnesium (Mg), zinc (Zn), beryllium (Be), calcium (Ca), strontium (sr), barium (Ba) etc. III group nitride system compound semiconductor layer of light emitting element in the embodiment is formed by using molecular beam epitaxy (MBE), hydride vapor phase epitaxy (HVPE), sputtering, ion plating etc. other than MOCVD.

[Convex Light Trapping Member]

Light trapping member used in the embodiment has a refractive index substantially equal to that of transparent substrate or a refractive index closer to that of the transparent substrate than that of III group nitride system compound semiconductor layer. When sapphire is selected as the transparent substrate, it is preferred that the light trapping member is of at least one selected from the group of $Al_2O_3$, $Eu_2O_3$, $La_2O_3$, $Sm_2O_3$, $WO_3$ and $Y_2O_3$.

The refractive index of light trapping member is substantially equal to or close to that of transparent substrate and, therefore, from the viewpoint of light reflection and transmission, the light trapping member can be regarded as integrated with the transparent substrate. Thus, light entering into the light trapping member is directly transmitted through the transparent substrate and then discharged outside the chip.

Meanwhile, there may exist a buffer layer between the transparent substrate and the light trapping member and, even in such a case, the buffer layer does not block the light transmission between the light trapping member and the transparent substrate. Because, the buffer layer is as thin as tens of nanometers and, therefore, it can be neglected optically.

The light trapping member can be formed with a high degree of freedom in designing since it is formed independently of the transparent substrate.

For example, even when the height of light trapping member is increases, by providing the light trapping member with inclined plane, III group nitride system compound semiconductor layer with a good crystal quality can be formed on the substrate without generating a cavity in the concave portion between light trapping members.

The method of forming the light trapping member is, though it may be suitably chosen depending on material, sputtering, deposition, spin coating, CVD etc.

[Embodiments of Light Emitting Element]

FIGS. 1A to 1F are cross sectional views showing a method of making a base structure to compose a light emitting element in the preferred embodiment according to the invention.

Figure 1B:
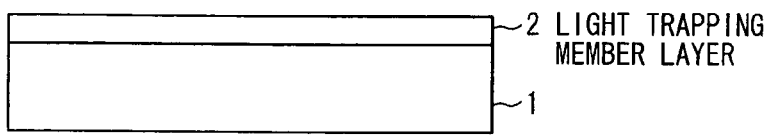

At first, a sapphire substrate 1 shown in FIG. 1A is provided and layer for light trapping member 2 is laminated thereon (FIG. 1B). In this embodiment, the light trapping member 2 is of $Al_2O_3$.

Figure 1C:
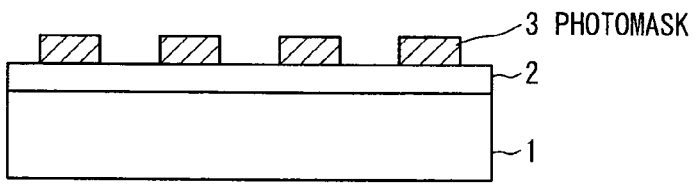
Figure 1D:
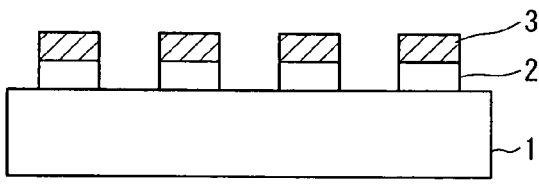

Then, as shown in FIG. 1C, a pattern of photomask 3 is formed on the light trapping member 2 layer. Then, as shown in FIG. 1D, exposed part of light trapping member 2 is removed by etching. Then, as shown in FIG. 1E, photomask 3 is removed.

Figure 1E:
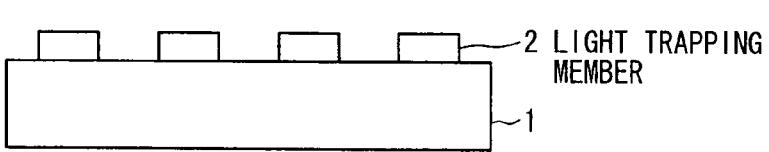

Thus, as shown in FIG. 1E, the stripe light trapping member 2 of $Al_2O_3$ is formed on the surface of sapphire substrate 1. The width, pitch and height of light trapping member 2 are 3 μm, 7 μm and 2.5 μm, respectively.

Figure 1F:
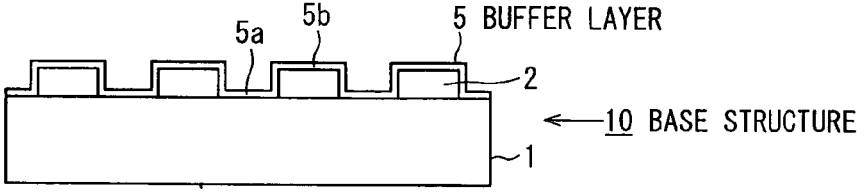

Then, as shown in FIG. 1F, buffer layer 5 of AlN is formed by MOCVD to obtain a base structure 10.

With respect to the buffer layer 5, portion 5a located on the sapphire substrate 1 can be a growth base point of III group nitride system compound semiconductor layer to be formed on the portion 5a. However, portion 5b located on the light trapping member 2 cannot be such a growth base point since it has different crystal form of buffer layer. Therefore, III group nitride system compound semiconductor to be grown on the portion 5a located on the sapphire substrate 1 is grown to cover the portion 5b located on the light trapping member 2. This growth method of III group nitride system compound semiconductor is called ELO (See prior art 1). Thus, penetrating crystal transition in the vertical direction can be prevented, and the crystal quality of III group nitride system compound semiconductor layer can be enhanced.

Figure 2:
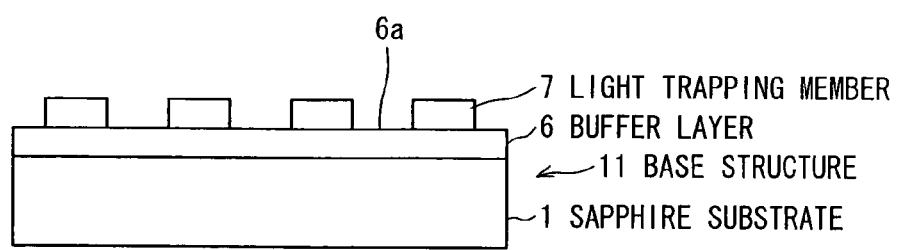
FIG. 2 is a cross sectional view showing another base structure 11 in a preferred embodiment of the invention.

FIG. 2 is a cross sectional view showing another base structure 11 in a preferred embodiment of the invention.

In the base structure 11, buffer layer 6 of AlN is provided between a light trapping member 7 and the sapphire substrate 1. The buffer layer 6 does not block the light transmission between the light trapping member 7 and the sapphire substrate since it is very thin.

Also in the base structure 11, III group nitride system compound semiconductor starts growing in the vertical direction from portion 6a of buffer layer 6 located between light trapping members, and then grows in the lateral direction. Thus, penetrating crystal transition in the vertical direction can be prevented.

Figure 3:
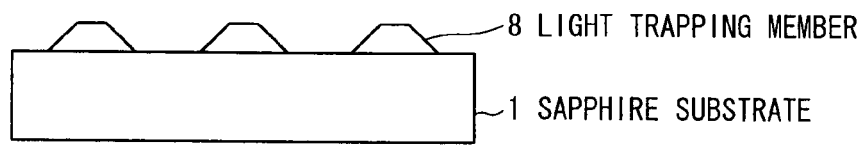
FIG. 3 is a cross sectional view showing a light trapping member 8 in a preferred embodiment of the invention.

FIG. 3 is a cross sectional view showing a light trapping member 8 in a preferred embodiment of the invention. The light trapping member 8 is provided with inclined plane. Thereby, even when the height of light trapping member increases, III group nitride system compound semiconductor layer with a good crystal quality can be formed on the substrate without generating a cavity in the concave portion between light trapping members.

Figure 4:
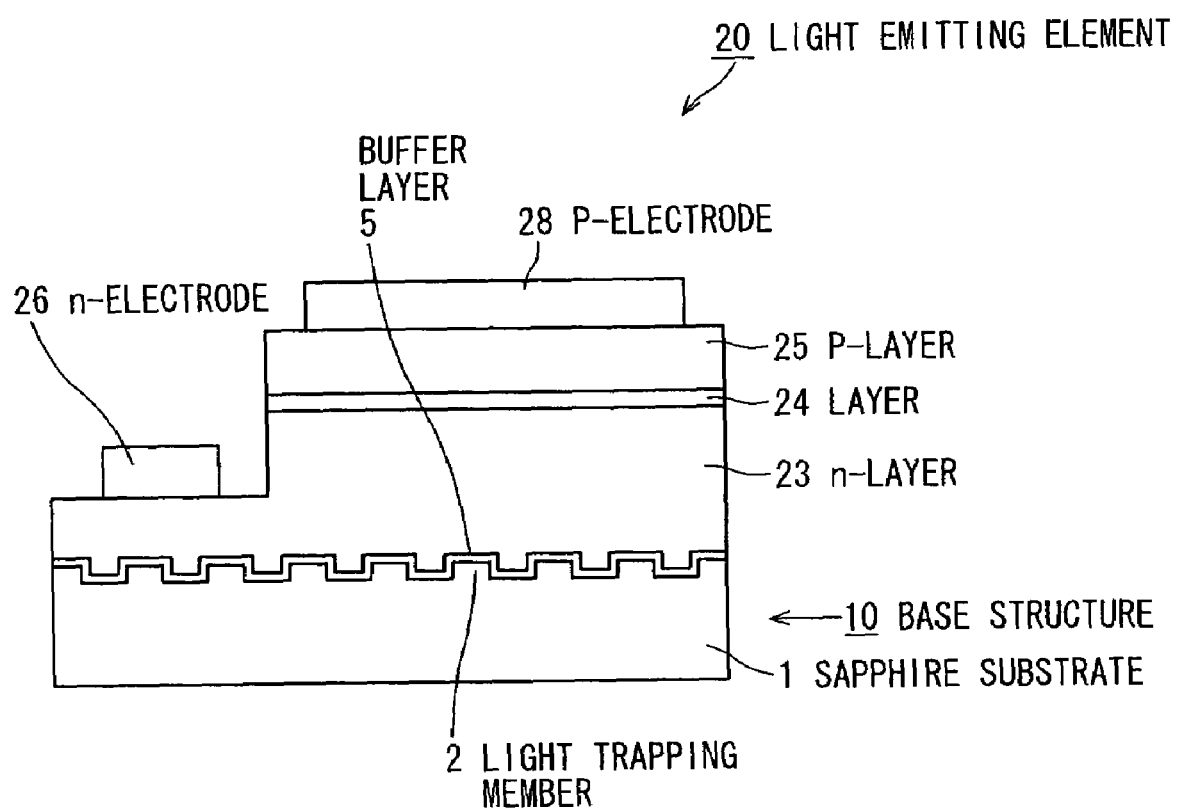
FIG. 4 is a schematic cross sectional view showing the structure of light emitting element 20 in a preferred embodiment of the invention.

FIG. 4 is a schematic cross sectional view showing the structure of light emitting element 20 in the preferred embodiment according to the invention.

Using the base structure 10 shown in FIG. 1F, the light emitting element 20 shown in FIG. 4 is fabricated. The details of layers of the light emitting element 20 are as follows:

| Layer | Composition |
|---|---|
| p-type layer 25 | p-GaN:Mg |
| layer 24 including light emitting layer | InGaN layer included |
| n-type layer 23 | n-GaN:Si |
| buffer layer 5 | AlN |
| substrate 1 | sapphire |

The light emitting element 20 thus composed is fabricated as follows.

At first, with the base structure 10 shown in FIG. 10 being continuously placed in the MOCVD apparatus used to form the buffer layer 7, n-type layer 23, layer 24 including light emitting layer and p-type layer 25 are sequentially grown by MOCVD. In this growth step, ammonia gas and alkyl compound gas of III group element, such as trimethylgallium (TMG), trimethylaluminum (TMA) and trimethylindium (TMI), are supplied onto the substrate (base structure 10) being heated at a given temperature to conduct thermal decomposition reaction. Thereby, desired crystal layers are formed on the substrate.

Next, using a mask of Ti/Ni, part of p-type layer 25, layer 24 and n-type layer 23 is removed by reactive ion etching to expose part of n-type layer 23 where to form the n-electrode pad 26.

Further, photoresist is coated on the entire surface of semiconductor layer, and photoresist on electrode-forming area in p-type layer 25 is then removed to expose the corresponding surface of p-type layer 25.

Then, p-electrode 28 of Rh is formed on the exposed p-type layer 25 by deposition. N-electrode 26 of Al and V layers is formed on the exposed n-type layer 23. Thereafter, they are alloyed by known method.

In case of face-up type light emitting element that opposing surface to the substrate is used as light-discharging surface, p-electrode and n-electrode are formed as next. First, photoresist is coated on the entire surface of semiconductor layer, and photoresist on electrode-forming area in p-type layer 25 is then removed to expose the corresponding surface of p-type layer 25. Then, Au—Co transparent electrode layer is formed on the exposed p-type layer 25 by deposition.

Then, p-electrode pad (not shown) of Au alloy and n-electrode pad of Al alloy are deposited.

Figure 5A:
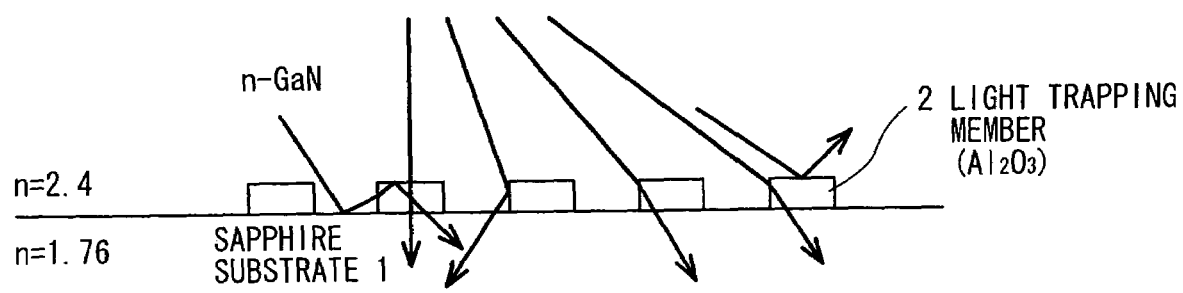
FIG. 5A is an illustration showing light behavior at the interface of sapphire substrate 1 and III group nitride system compound semiconductor layer to be induced by the light trapping member 2 in the embodiment of the invention.
Figure 5B:
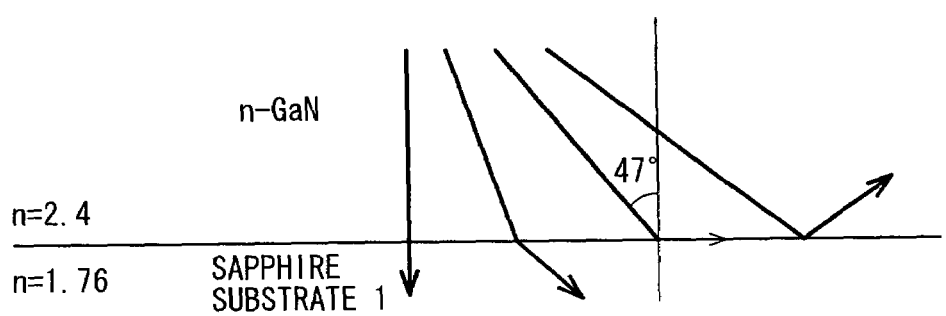
FIG. 5B is an illustration showing light behavior at the interface of sapphire substrate 1 and III group nitride system compound semiconductor layer in the conventional light emitting element without light trapping member.

FIG. 5A is an illustration showing light behavior at the interface of sapphire substrate 1 and III group nitride system compound semiconductor layer to be induced by the light trapping member 2 in the embodiment of the invention. FIG. 5B is an illustration showing light behavior at the interface of sapphire substrate 1 and III group nitride system compound semiconductor layer in the conventional light emitting element without light trapping member. In FIGS. 5A and 5B, n represents a refractive index.

In the light emitting element 20 formed as above, of light emitted from the layer 24 including light emitting layer, as shown in FIG. 5A, light component projecting onto the upper surface of light trapping member 2 at an incident angle of more than 47 degrees is subjected to total reflection. However, as shown in FIG. 5A, the other light component is trapped into the light trapping member 2 and sapphire substrate 1 and then discharged outside the chip.

Namely, of light emitted from the layer 24 including light emitting layer, even light component with such an incident angle that could be reflected if the interface of sapphire substrate 1 and III group nitride system compound semiconductor layer were flat without light trapping member 2 (FIG. 5B) can transmit through the sapphire substrate 1 while being trapped into the light trapping member 2 (FIG. 5A), except for the light component projecting onto the upper surface of light trapping member 2. Accordingly, the light extraction efficiency in the direction of substrate can be improved.

Especially in case of flip-chip type light emitting element, the improvement of light extraction efficiency in the direction of substrate is obviously advantageous. Also, in case of face-up type light emitting element, it is advantageous since the amount of light to be entered into the substrate increases, where the light is reflected on a silver paste, which is used to adhere the substrate to an external supporting member such as a lead frame, and then is discharged outside the chip. In addition, both flip-chip type and face-up type can have improved emission efficiency due to enhancement in crystal quality of III group nitride system compound semiconductor layer.

If necessary, the sapphire substrate 1 and buffer layer 5 may be removed after fabricating the light emitting element.

The buffer layer 5 may be of GaN, InN, AlGaN, InGaN, AlInGaN etc. other then AlN.

The n-type layer 23 may be of AlGaN, InGaN or AlInGaN other than GaN.

The n-type layer 23 may include an n-type impurity of Ge, Se, Te, C etc. other than Si.

The n-type layer 23 may have a double layer structure composed of low electron-density $n^-$ layer located on the side of layer 24 and high electron-density $n^+$ layer on the side of buffer layer 5.

The layer 24 may include a quantum well type light emitting layer. The structure of light emitting element may be single-hetero type, double-hetero type or homo junction type.

The layer 24 may include a wide bandgap III group nitride system compound semiconductor layer with an acceptor such as Mg doped on the side of p-type layer 25. This layer prevents electrons injected into the layer 24 from diffusing in the p-type layer 25.

The p-type layer 25 of GaN with a p-type impurity, Mg doped is formed on the layer 24 including light emitting layer. The p-type layer 25 may be of AlGaN, InGaN or AlInGaN. The p-type impurity doped may be Zn, Be, Ca, Sr or Ba.

The p-type layer 25 may have a double layer structure composed of low hole-density $p^-$ layer located on the side of layer 24 and high hole-density $p^+$ layer on the side of p-electrode 28.

The III group nitride system compound semiconductor layer of light emitting element in the embodiment may be formed by using molecular beam epitaxy (MBE), hydride vapor phase epitaxy (HVPE), sputtering, ion plating etc. other than MOCVD.

Figure 6:
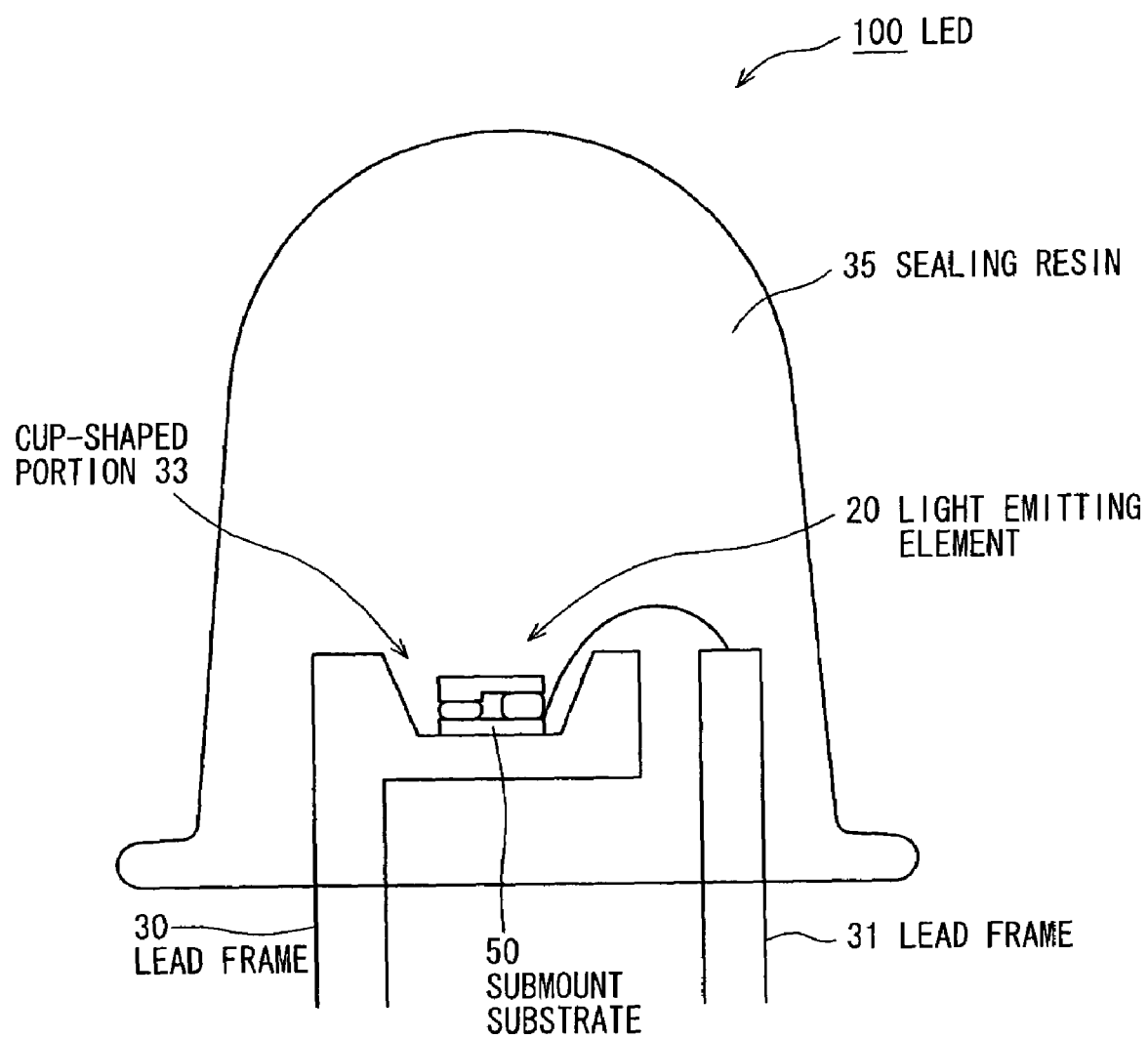
FIG. 6 is a schematic cross sectional view showing a light emitting diode 100 with the light emitting element 20 in the embodiment.

FIG. 6 is a schematic cross sectional view showing a light emitting diode 100 with the light emitting element 20 in the embodiment. The light emitting diode 100 is of flip-chip type and is composed of the light emitting element 20, lead frames 30, 31, a submount substrate 50 and sealing resin 35.

Figure 7:
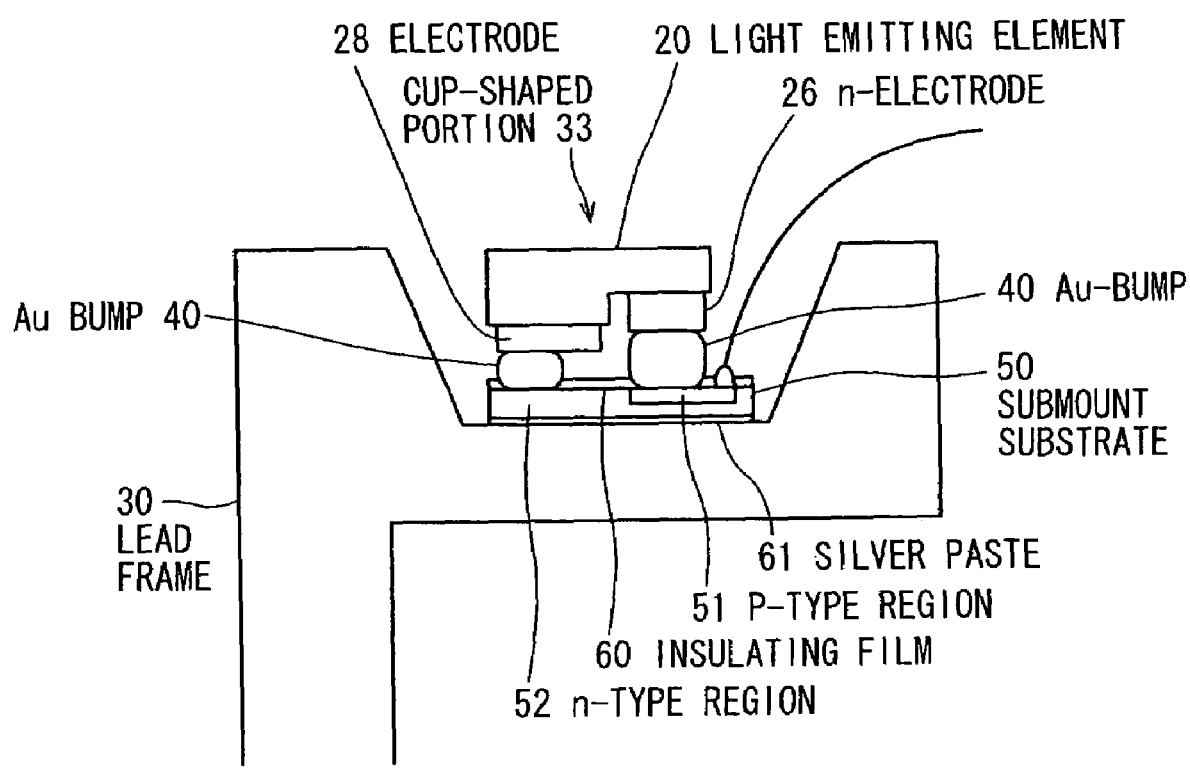
FIG. 7 is a partially enlarged cross sectional view showing the periphery of a cup-shaped portion 33 in FIG. 6.

FIG. 7 is a partially enlarged cross sectional view showing the periphery of a cup-shaped portion 33 in FIG. 6. As shown in FIG. 7, the light emitting element 20 is mounted on the cup-shaped portion 33 of the lead frame 30 through the submount substrate 50. The submount substrate 50 has p-type region 51 and n-type region 52, and insulating film 60 of SiO2 is formed on its surface except for part where Au bumps 40 are mounted. As shown, by mounting the light emitting element 20 on the submount substrate 50 while turning the electrode side downward, the n-electrode 26 is connected through the Au bump 40 to the p-type region 51 of submount substrate 50 and the p-electrode 28 is connected through the Au bump 40 to the n-type region 52 of submount substrate 50. Thus, the p-electrode 28 and n-electrode 26 of light emitting element 20 are electrically connected to the p-type region 51 and n-type region 52, respectively, of submount substrate 50. The submount substrate 50 is fixedly adhered onto the cup-shaped portion 33 of lead frame 30 through silver paste 61 on the opposite side to the surface where the light emitting element 20 is mounted.

Figure 8:
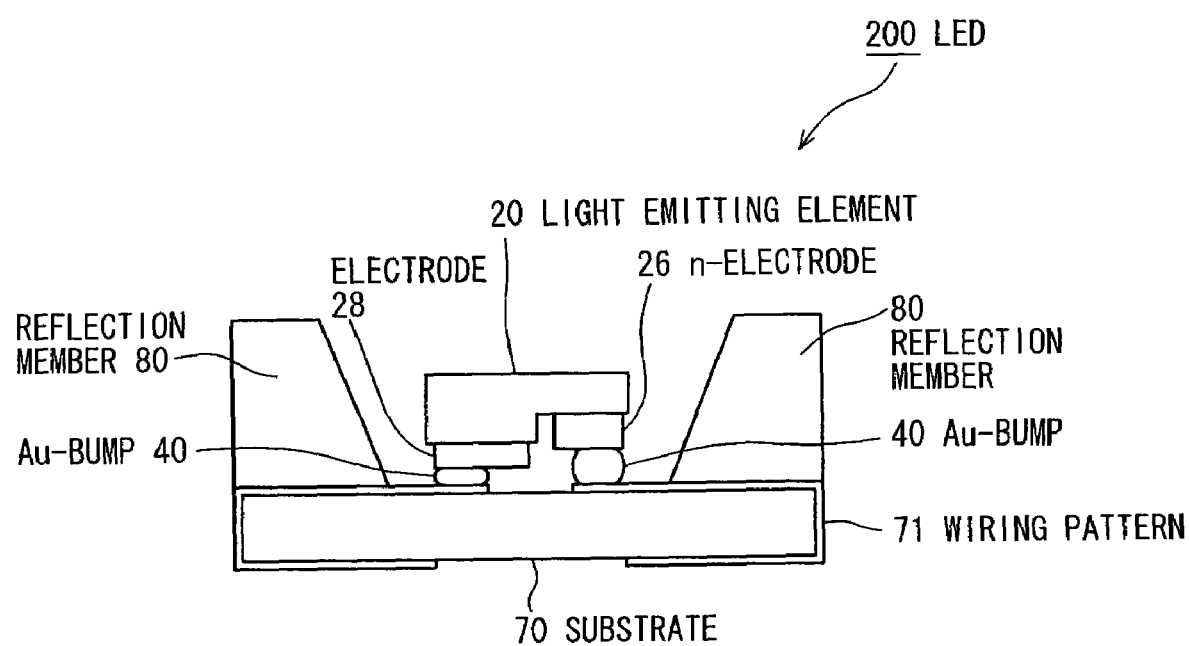
FIG. 8 is a schematic cross sectional view showing another light emitting diode 200 with the light emitting element 20 in a preferred embodiment of the invention.

FIG. 8 is a schematic cross sectional view showing another light emitting diode 200 with the light emitting element 20 in the preferred embodiment according to the invention. The light emitting diode 200 is of surface mount device (SMD) type. In FIG. 8, like components of LED 100 are indicated by the same numerals.

LED 200 is composed of the light emitting element 20, a substrate 70 and reflection member 80. Like LED 100, the light emitting element 20 is mounted on the substrate 70 while turning the electrode side downward. A wiring pattern 71 is formed on the surface of substrate 70, and the p-electrode 28 and n-electrode 26 of light emitting element 20 are adhered through the Au bumps 40 to the wiring pattern 71 and, thereby, the electrodes of light emitting element 20 are electrically connected with the wiring pattern 71. The reflection member 80 is positioned surrounding the light emitting element 20, the reflection member 80 is of white resin and, on its surface, reflects light emitted from the light emitting element 20 at a high efficiency.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A III group nitride system compound semiconductor light emitting element, comprising:
   a transparent substrate that comprises a material other than a III group nitride system compound semiconductor;
   a convex light trapping member that is formed over a surface of the transparent substrate; and
   a III group nitride system compound semiconductor layer that is formed on the surface of the transparent substrate;
   wherein the light trapping member has a refractive index substantially equal to a refractive index of the transparent substrate or closer to the refractive index of the transparent substrate than a refractive index of the III group nitride system compound semiconductor layer, and
   wherein an interface is provided between the light trapping member and the transparent substrate.

2. The III group nitride system compound semiconductor light emitting element according to claim 1, wherein the transparent substrate comprises sapphire, and
   wherein the light trapping member comprises at least one of $Al_2O_3$, $Eu_2O_3$, $La_2O_3$, $Sm_2O_3$, $WO_3$ and $Y_2O_3$.

3. A pretreated transparent substrate, comprising:
   a transparent substrate that comprises a material other than a III group nitride system compound semiconductor; and a convex light trapping member that is formed over a surface of the transparent substrate;

wherein the light trapping member has a refractive index substantially equal to a refractive index of the transparent substrate or closer to the refractive index of the transparent substrate than a refractive index of a III group nitride system compound semiconductor, and wherein an interface is provided between the light trapping member and the transparent substrate.

4. The III group nitride system compound semiconductor light emitting element according to clam 1, wherein said convex light trapping member is formed directly on the surface of the transparent substrate.

5. The III group nitride system compound semiconductor light emitting element according to claim 1, further comprising:

a buffer layer disposed on the surface of said transparent substrate, wherein said convex light trapping member is formed on the buffer layer such that the buffer layer is disposed between said convex light trapping member and said transparent substrate.

6. The III group nitride system compound semiconductor light emitting element according to claim 1, wherein said convex light trapping member comprises an uneven pattern formed across the surface of the substrate, from a first end of the substrate to a second end of the substrate.

7. The III group nitride system compound semiconductor light emitting element according to claim 5, wherein said buffer layer comprises at least one of AlN, GaN, InN, AlGaN, InGaN and AlInGaN.

8. The III group nitride system compound semiconductor light emitting element according to claim 1, wherein said convex light trapping member comprises:

inclined side portions; and a top portion positioned between said inclined side portions.

9. The III group nitride system compound semiconductor light emitting element according to claim 1, wherein a light component projecting onto a top surface of the convex light trapping member at an incident angle of more than approximately 47 degrees is subjected to total reflection, and wherein other light components are trapped into the convex light trapping member and the transparent substrate and are discharged outside of the transparent substrate.

10. The III group nitride system compound semiconductor light emitting element according to claim 1, wherein light entering into said convex light trapping member is directly transmitted through said transparent substrate and then discharged outside of said substrate.

11. The III group nitride system compound semiconductor light emitting element according to claim 1, wherein said convex light trapping member is formed independently from said transparent substrate.

12. The III group nitride system compound semiconductor light emitting element according to claim 1, wherein said convex light trapping member comprises a width of 0.1 μm to 10 μm, a pitch of 0.2 μm to 20 μm and a height of 0.1 μm to 5 μm.

13. The pretreated transparent substrate according to claim 3, wherein the transparent substrate comprises sapphire, and wherein the light trapping member comprises at least one of $Al_2O_3$, $Eu_2O_3$, $La_2O_3$, $Sm_2O_3$, $WO_3$ and $Y_2O_3$.

14. The pretreated transparent substrate according to claim 3, wherein said convex light trapping member is formed directly on the surface of the transparent substrate.

15. The pretreated transparent substrate according to claim 3, further comprising:

a buffer layer disposed on the surface of said transparent substrate, wherein said convex light trapping member is formed on the buffer layer such that the buffer layer is disposed between said convex light trapping member and said transparent substrate.

16. The pretreated transparent substrate according to claim 3, wherein said convex light trapping member comprises an uneven pattern formed across the surface of the substrate, from a first end of the substrate to a second end of the substrate.

17. The pretreated transparent substrate according to claim 3, wherein said convex light trapping member comprises:

inclined side portions; and a top portion positioned between said inclined side portions.

18. The pretreated transparent substrate according to claim 3, wherein a light component projecting onto a top surface of the convex light trapping member at an incident angle of more than approximately 47 degrees is subjected to total reflection, and wherein other light components are trapped into the convex light trapping member and the transparent substrate and are discharged outside of the transparent substrate.

19. A light emitting diode, comprising:

a III group nitride system compound semiconductor light emitting element, comprising:

a transparent substrate that comprises a material other than a III group nitride system compound semiconductor;

a convex light trapping member that is formed over a surface of the transparent substrate; and a III group nitride system compound semiconductor layer that is formed on the surface of the transparent substrate, wherein the light trapping member has a refractive index substantially equal to a refractive index of the transparent substrate or closer to the refractive index of the transparent substrate than a refractive index of the m group nitride system compound semiconductor layer, and wherein an interface is provided between the light trapping member and the transparent substrate.

20. The III group nitride system compound semiconductor light emitting element according to claim 1, wherein light entering into said light emitting member is directly transmitted through the transparent substrate.

21. The pretreated transparent substrate according to claim 3, wherein light entering into said light emitting member is directly transmitted through the transparent substrate.

22. The light emitting diode according to claim 19, wherein light entering into said light emitting member is directly transmitted through the transparent substrate.

* * * * *